United States Patent
Bruekers

[19]

[11] Patent Number: 6,041,302

[45] Date of Patent: Mar. 21, 2000

[54] DATA COMPRESSION/EXPANSION USING A RICE ENCODER/DECODER

[75] Inventor: Alphons A. M. L. Bruekers, Eindhoven, Netherlands

[73] Assignee: U.S. Philips Corporation, New York, N.Y.

[21] Appl. No.: 09/091,727

[22] PCT Filed: Nov. 10, 1997

[86] PCT No.: PCT/IB97/01415

§ 371 Date: Jun. 22, 1998

§ 102(e) Date: Jun. 22, 1998

[87] PCT Pub. No.: WO98/21830

PCT Pub. Date: May 22, 1998

[30] Foreign Application Priority Data

Nov. 11, 1996 [EP] European Pat. Off. .............. 96203108

[51] Int. Cl.[7] .................................................. G10L 9/18
[52] U.S. Cl. .......................................... 704/503; 704/212
[58] Field of Search ..................... 704/500, 501, 704/503, 504, 200, 201, 219, 212, 502

[56] References Cited

U.S. PATENT DOCUMENTS

| | | | |
|---|---|---|---|
| 5,541,594 | 7/1996 | Huang et al. ............................... | 341/51 |
| 5,598,354 | 1/1997 | Fang et al. ........................... | 364/715.02 |
| 5,680,129 | 10/1997 | Weinberger et al. ...................... | 341/65 |
| 5,687,255 | 11/1997 | Yeh ......................................... | 382/232 |
| 5,764,374 | 6/1998 | Seroussi et al. ........................... | 341/65 |
| 5,774,597 | 6/1998 | Wilson ..................................... | 382/250 |
| 5,812,700 | 9/1998 | Fang et al. ............................... | 382/239 |
| 5,822,457 | 10/1998 | Yeh ......................................... | 382/232 |
| 5,835,034 | 11/1998 | Seroussi et al. ........................... | 341/65 |

OTHER PUBLICATIONS

R.F. Rice et al., "Adaptive Variable–Length Coding for Efficient Compression of Spacecraft Television data", IEEE Trans on CT, vol. 16(9), pp. 889–897, Dec. 1971.

Center for Signal & Image Processing, Georgia Inst. Of Technology, Hans et al., "AudioPak–an interger arithmetic lossless Audio codec" P. 589. Mar. 1998.

Dept. of Computer Sci., Brown Univ., Howard et al., "Design and analysis of fast text compression based on quasi–arithmetic coding", pp. 98–107. Mar. 1993.

Dept. of Comput. Science., Polytech Univ., "Adaptive coding of DCT coefficients by Golomg–RIce codes", pp. 516–520, vol. 1. Oct. 1998.

Dept. of Electr. Eng.., New South Wales Univ. Roger et al., "Lossless compression of AVIRIS images". pp. 713–719.vol.5. May 1996.

"A Method for the Construction of Minimum–Redundancy Codes", by David A. Huffman, Proc. of the IRE, vol. 40(10), Sep. 1952, document D1.

*Primary Examiner*—Richemond Dorvil
*Attorney, Agent, or Firm*—Leroy Eason

[57] ABSTRACT

A data compression apparatus for data compressing a digital information signal obtained from a digital audio signal. The digital information signal includes p-bit samples, where p is an integer larger than 1. The apparatus has an input (16) for receiving the digital information signal, and a lossless compression unit (18) for carrying out a substantially lossless compression step on the digital information signal so as to obtain a data compressed digital information signal. The lossless compression unit includes a Rice encoder, which is distinguishable by a code parameter m. Further, an output terminal (22) is available for supplying the data compressed digital information signal. The Rice encoder has a generator unit (30) for generating the code parameter m from N samples of the digital information signal, in accordance with a formula which optimizes the value of m for each frame of N samples.

15 Claims, 2 Drawing Sheets

DATA COMPRESSION/EXPANSION USING A RICE ENCODER/DECODER

BACKGROUND OF THE INVENTION

1. Field of the Invention

The invention relates to a data compression apparatus for data compressing a digital information signal obtained from a digital audio signal, the digital information signal comprising p-bit samples, where p is an integer larger than 1, the apparatus comprising means for receiving the digital information signal, lossless compression means for carrying out a substantially lossless compression step on the digital information signal so as to obtain a data compressed digital information signal, the lossless compression means comprising a Huffman type encoder, output means for supplying the data compressed digital information signal, to a data expansion apparatus for data expanding a data compressed digital information signal obtained from a digital audio signal, the apparatus comprising input means for receiving the data compressed digital information signal, lossless expanding means for carrying out a substantially lossless data expansion step on the data compressed digital information signal so as to obtain a replica of the digital information signal, the lossless expanding means comprising a Huffman type decoder, output means for supplying the replica of the digital information signal, to a transmitter comprising the data compression apparatus, to a receiver comprising the data expansion apparatus, and to a method for data compressing said digital information signal.

2. Description of the Related Art

Huffman type encoders and decoders are well known in the art. Reference is made in this respect to the publication 'A method for the construction of minimum-redundancy codes', by D. A. Huffman in Proc. of the IRE, Vol. 40(10), September 1952, and to the publication 'Adaptive variable length coding for efficient compression of spacecraft television data', by R.F. Rice et al in IEEE Trans on CT, vol. 16(9), 1971.--.

For the DVD (Digital Versatile Disc) an audio-only application called DVD Audio is, at the time of writing, under discussion. If all wishes from the audio community with respect to the number of channels, sampling frequency, number of bits per sample and playing time have to be accommodated, even the high capacity of DVD is not sufficient.

SUMMARY OF THE INVENTION

The invention aims at providing a data compression apparatus and a data expansion apparatus which is very suitable for data compressing and expanding a digital audio signal.

The data compression apparatus in accordance with the invention is characterized in that the Huffman type encoder is a Rice encoder, which Rice encoder is distinguishable by a code parameter m, the Rice encoder comprising generator means for generating said code parameter from N samples of the digital information signal in accordance with the following formula:

$$A \cdot \log_2\left\{\left(\frac{B}{N}\right) \cdot \sum_{n=1}^{N} |x[n]|\right\}$$

where A and B are constants and x[n] is the n-th sample of the N samples, where N is an integer larger than 0. Further, a data expansion apparatus for data expanding a data compressed digital information signal obtained from a digital audio signal, the apparatus comprising input means for receiving the data compressed digital information signal, lossless expanding means for carrying out a substantially lossless data expansion step on the data compressed digital information signal so as to obtain a replica of the digital information signal, the lossless expanding means comprising a Huffman type decoder, output means for supplying the replica of the digital information signal is characterized in that the Huffman type decoder is a Rice decoder, which Rice decoder is distinguishable by a code parameter m, the Rice decoder comprising generator means for generating said code parameter from N samples of the replica of the digital information signal in accordance with the following formula:

$$A \cdot \log_2\left\{\left(\frac{B}{N}\right) \cdot \sum_{n=1}^{N} |x[n]|\right\}$$

where A and B are constants and x[n] is the n-th sample of the N samples, where N is an integer larger than 0. The invention is based on the following recognition.

A number of different formats have been proposed for DVD Audio, all claiming to fulfill requirements set by consumers, content providers, equipment manufacturers, etc. Most proposals are enhancements of the current CD parameters: higher sampling rate, increased resolution, and more channels. The common constraints for all of the proposed DVD Audio formats are a playing time of at least that of the current CD Audio, which is approximately 75 minutes and the fact that lossy compression is not acceptable for high quality audio. Another requirement formulated is that to suit both the people with two-channel stereo reproduction equipment and those with 5-channel reproduction equipment, both a two-channel and a multi-channel signal should be available. Since, in general, these two mixes are created in a studio out of a high number of channels, the stereo signal is not necessarily a down-mix of the multi-channel signal. Therefore, matrixing is not an option for retrieving the 2-channel mix from the 5-channel mix. Thus, in total 2+5=7 separate channels are required.

In order to store these signals on a DVD, while leaving sufficient playing time, the bit rate needs to be reduced.

Lossless coding can provide the bit-rate reduction needed without compromising audio quality in any way. An important requirement set is that editability should be possible on DVD. This means that the lossless decoder should be able to start decoding at any position on a predefined grid, i.e. without the need for decoding previous data. Finally the decoder should be of low complexity since it will be present in every DVD player.

A lossless audio coding scheme will be proposed which is able to realise the required compression ratio, eg. for DVD Audio.

Lossless coding is a technique to reduce the required storage capacity for data, such as text files and computer program data. After decoding, the compressed data is perfectly reconstructed. Well known text and data compression programmes and techniques such as "Lempel Ziv", "pkzip", "compress" and "pack" result in a relatively poor compression ratio when applied on a PCM audio signal.

The specific characteristic of a PCM audio signal is that audio is represented as a sequence of PCM (multi-bit) samples, which makes it more effective to process the PCM samples instead of the individual bits or bytes. Between consecutive PCM samples dependencies exist. Their exploitation in enhanced lossless audio coding algorithms result in a higher compression ratio.

Generally, a lossless audio coder can be broken up into two basic operations, 'source modelling' by means of prediction and entropy coding.

Source modelling is applied to the audio signal so as to obtain a residual of the audio signal, suitable for encoding in an Entropy encoder. The residual signal is data compressed by means of entropy coding. This results in a variable-rate bit stream which is transmitted over the channel. The bit stream also contains source model parameters and other side information.

In the decoder the original input signal is reconstructed by entropy decoding and source synthesis.

The objective of the encoder is to optimize data compression, so as to realize a maximum data compression ratio. The challenge at the decoder side is to minimize the complexity.

In one embodiment of the invention, the short term (pseudo) stationarity of signals is exploited in the data compression step, by analyzing and processing the signal in frames. This period of pseudo stationarity is in the order of 25 ms. The advantage of processing a signal in frames is that these frames can be seen as isolated blocks providing editability. In practice, the statistical properties of an audio signal vary and thus also the optimal frame length varies. However, for an easy handling, the frame length is chosen constant.

The frame length can, as an example, be set at 1024 samples for 44.1 kHz sampling frequency, corresponding to 23 ms. This appears to be a good balance between editability and performance. For shorter frame lengths the compression performance decreases and for longer frame lengths the editability becomes impractical.

In another embodiment, no framing is used, but the data compression of a sample is determined by N previous samples of the information signal to be data compressed.

Linear predictive coding, also known as intra-channel prediction, is applied to remove the linear dependencies between successive samples of the audio signal. In a general linear prediction scheme, a residual signal x[n] is constructed by subtracting a prediction of the audio signal from the audio signal. The prediction of the current sample of the audio signal is based on previous samples of the audio signal.

Variable length coding, finally, removes redundancy from the signal x[n]. Again, in this whole process, no information is lost. There are numerous methods available for entropy coding. For a low decoder complexity, in accordance with the invention, a Huffman like code is used.

The Rice codes appeared to be a promising subset of the Huffman codes, since they can be distinguished by only one parameter m. For a description of Rice codes, reference is made to document D2 in the list of related documents. The Rice code is in essence the Huffman code for a Laplacian probability density function (PDF)

$$p(x) = \frac{1}{\sigma\sqrt{2}} \exp\frac{-\sqrt{2}\,|x|}{\sigma}$$

which turns out to be a good approximation for the actual residual signal x[n]. The Laplacian PDF is matched to p(x) by only one parameter σ.

A Rice code-word obtained from a sample word of the residual signal x[n] consists of four parts. The first part is a single bit indicating the sign of the sample. The second part consists of the m least significant bits (LSBs) of the absolute value of the sample. The third part is the unary representation of sample without the m LSBs. The final part is a single bit delimiter for the unary notation.

In the first mentioned embodiment, the value of m is optimized for each frame of N samples by means of the following formula:

$$A \cdot \log_2 \left\{ \left(\frac{B}{N}\right) \cdot \sum_{n=1}^{N} |x[n]| \right\}$$

where A and B are constants and x[n] is the n-th sample of the N samples, where N is an integer larger than 0.

Preferably, A=1 and B=1 and m=⌊M, where $$M = A \cdot \log_2 \left\{ \left(\frac{B}{N}\right) \cdot \sum_{n=1}^{N} |x[n]| \right\}$$

and the sign '⌊' signifies a rounding of the value of M to the value of the nearest lower integer.

Decoding a Rice code-word is straightforward and requires very few computations. The sign bit and the m LSBs are directly available. The remaining part can be reconstructed by simply counting the number of zero-valued bits prior to the delimited bit.

BRIEF DESCRIPTION OF THE DRAWINGS

These and other aspects of the invention will be apparent from and elucidated further with reference to the embodiments described in the following FIGURE description, in which.

DESCRIPTION OF THE PREFERRED EMBODIMENTS

Figure 1:
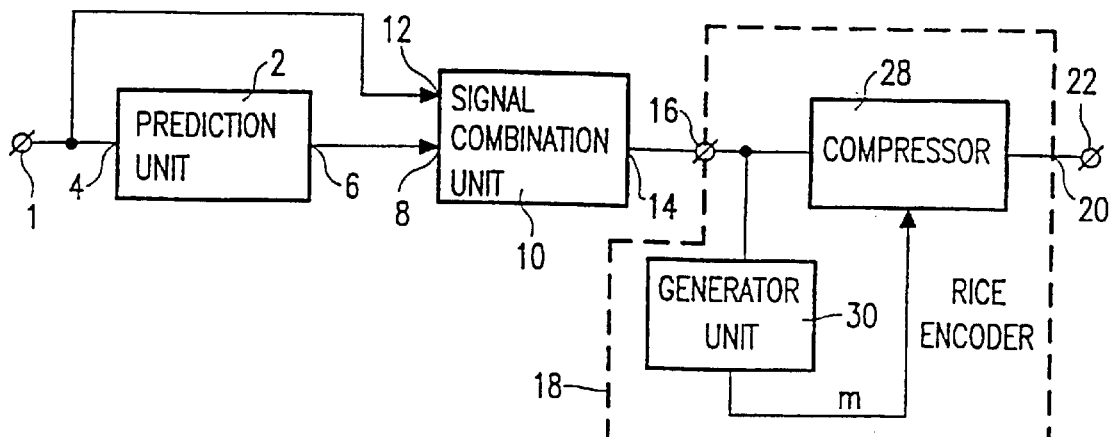
FIG. 1 shows an embodiment of the data compression apparatus.

FIG. 1 shows an embodiment of the data compression apparatus in accordance with the invention. The apparatus has an input terminal 1 for receiving p-bit samples of a digital audio signal, eg. sampled at 44.1 kHz. The apparatus comprises a prediction unit 2, well known in the art, which has an input 4 coupled to the input terminal 1, and an output 6. The output 6 of the prediction unit 2 is coupled to an input 10 of a signal combination unit 10, which has a second input 12 coupled to the input terminal 1 and an output 14. The output 14 is coupled to a terminal 16 which is the input of a data compression unit 18. An output 20 of the data compression unit 18 is coupled to an output terminal 22 of the apparatus.

The prediction unit 2 is adapted to generate a predicted version of the digital audio signal applied to its input 4 and to supply the predicted version to the output 6. The signal combination unit 10 is adapted to combine the audio signal applied to its input 12 and the predicted version of the audio signal applied to its input 8 in a subtractive way, so as to obtain a residual output signal which is supplied to the output 14. The output signal present at the output 14 of the combination unit 10 is representative of the error between the digital audio signal applied to the input 12 and the predicted version of the audio signal applied to the input 8. When the samples of both the digital audio signal and the predicted version of the digital audio signal are applied to the combination unit 10 with the same polarity, the combination unit 10 will be in the form of an subtractor unit. However, if the samples of one of the digital audio signal and the predicted version of the digital audio signal are inverted in polarity relative to the other one of the two signals, prior to combining them in the combination unit 10, the combination unit 10 will be in the form of a adder unit.

Figure 2:
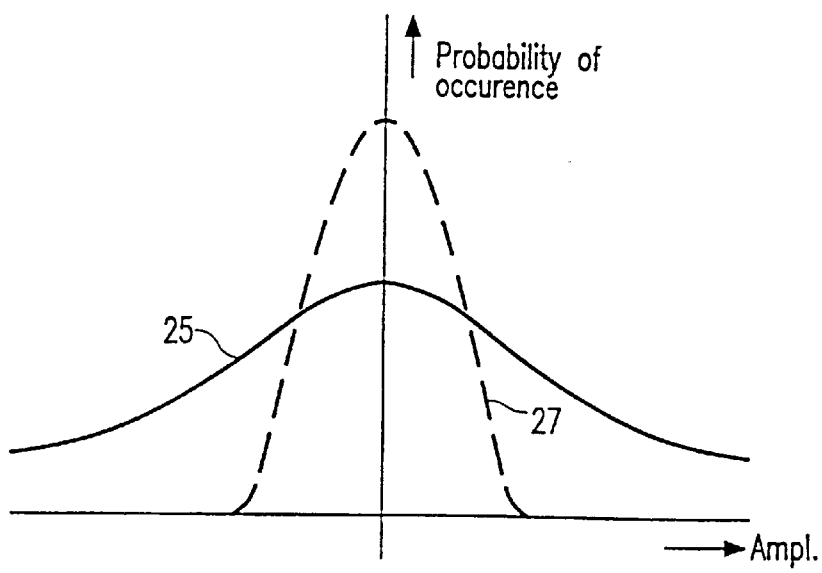
FIG. 2 shows the probability of occurrence of the samples of a signal as a function of their amplitude, for a wideband digital audio signal and for a residual signal obtained from said wideband digital audio signal after prediction and subtracting the audio signal from its predicted version.

In general, it can be said that the prediction unit 2 and the combination unit 10 result in decreasing the variance in the amplitude distribution of the digital audio signal. As an example, the curve 25 in FIG. 2 shows the amplitude distribution of the digital audio signal applied to the input 1, whilst the curve 27 shows the amplitude distribution of the residual signal present at the terminal 16.

The signal having the amplitude distribution in correspondence with the curve 27 can be encoded very efficiently by means of a data compression unit 18 which is of the Huffman type. More specifically, an even more efficient encoding can be realised by means of a compression unit 18 in the form of a Rice encoder. The Rice encoder 16 includes a data compressor 28 and a generator unit 30 for determining a parameter m, which is supplied to in the data compressor 28 so as to enable encoding of the signal supplied to the input 16.

The functioning of the Rice encoder 18 is as follows. The parameter m is a value which is representative of the mean position of the most significant '1' bit in N samples of the information signal applied to the input 16. Suppose, the value of m equals 3, and that a 16-bit sample of the information signal applied to the input 16 has to be encoded in the Rice encoder. Encoding said 16-bit sample in the data compressor 28 is realized by taking the (m=)3 least significant bits of the 16-bit sample. The decimal value corresponding to the remaining 13 bit word equals the number of 'zeroes' to be added to the m least significant bits, followed by a '1'-bit and a sign-bit, the sign bit indicating the polarity of the sample.

An example: suppose the 16-bit sample has a decimal value of 19. This sample thus equals '0000 . . . 010011'. With m=3, the bits 011 are retrieved from the sample. The remaining 13-bit word equals '0000 . . . 010', which corresponds to the decimal value 2. As a result two 'zeroes' are added, followed by a '1' bit. In addition a 'sign' bit is added before the bit sequence obtained. The resulting data compressed sample equals '?011001', where the ?-sign indicates the sign-bit. As a result, the 16bit sample is compressed into a 7-bit word.

In order to data expand the data compressed sample, it is required to know the value m, so that the value m should be transmitted as well.

It should however be noted that it is not always necessary to transmit the value m, namely in those situations where m is derived from N samples preceding the sample to be compressed. This will be made clear later on in this description.

The derivation of the value for the parameter m will be described hereafter. The generator unit 30 receives N samples supplied to the input 16 and derives the value for m using the following formula:

$$A \cdot \log_2 \left\{ \left( \frac{B}{N} \right) \cdot \sum_{n=1}^{N} |x[n]| \right\}$$

where A and B are constants and x[n] is the n-th sample of the N samples, where N is an integer larger than 1.

More specifically, m=⌊M, where $$M = A \cdot \log_2 \left\{ \left( \frac{B}{N} \right) \cdot \sum_{n=1}^{N} |x[n]| \right\}$$

and the sign '⌊' signifies a rounding of the value of M to the value of the nearest lower integer. It will be clear that in another embodiment one could have rounded M to the value of the nearest higher integer. But this would mean a lower data compression ratio realized in the compressor 28.

In one option, the value m for encoding (data compressing) a sample can be derived from N samples preceding the sample to be converted. In this option, the encoding of the first N samples require a special treatment. As an example, where N is assumed to be equal to 10, for encoding the first sample, m could be chosen a predetermined value, eg. equal to p, or p/2. For encoding the second sample, m could be obtained using the above formula for N=1, using the first sample value. For encoding the third sample, m could be obtained using the above formula for N=2, using the first and second sample value, and so on, until upon encoding the 11th sample the above formula can be used for N=10, using the previous ten sample values.

In this option, there is no need for transmitting the m values to a corresponding Rice decoder, as will be made clear hereafter, when discussing such Rice decoder.

In a second option, the generator unit 30 is adapted to generate the code parameter m for subsequent frames of N samples of the digital information signal, as per one of the formula given above. The compressor 28 encodes a frame of N samples in accordance with the m value derived for that frame. In this option, it is required to transmit the value for m for each frame together with the data compressed samples in that frame to a corresponding Rice decoder so as to enable a decoding of the data compressed information signal, in order to obtain a replica of the original information signal.

In a preferred embodiment, A and B are both chosen equal to 1.

Encoding the information signal in the way described above offers a more simple derivation of the parameter m, compared to prior art Rice encoders, as well as a slightly better performance than those prior art Rice encoders.

Figure 3:
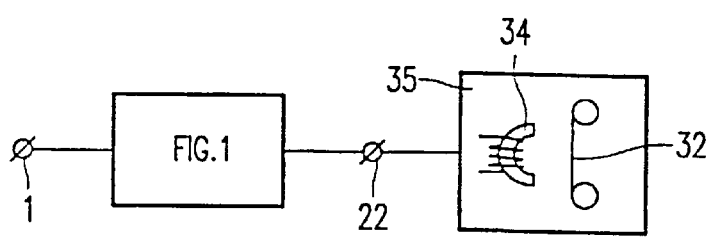
FIG. 3 shows the data compression apparatus of FIG. 1 incorporated in a recording apparatus for recording the data compressed information signal on a record carrier.

FIG. 3 shows the incorporation of the data compression apparatus of FIG. 1 in a recording apparatus. The recording apparatus further comprises a write unit 35 for writing the data compressed information signal in a track on the record carrier 32. In the present example, the record carrier 32 is a magnetic record carrier, so that the write unit 35 comprises at least one magnetic head 34 for writing the data compressed information signal in the record carrier 32. The record carrier may however be an optical record carrier, such as a CD disk or a DVD disk.

Figure 4:
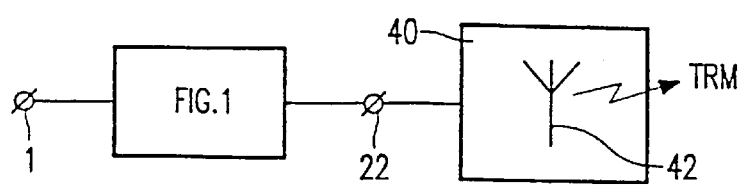
FIG. 4 shows the data compression apparatus incorporated in a transmission apparatus for transmitting the data compressed digital information signal via a transmission medium.

FIG. 4 shows an embodiment of a transmitter for transmitting an audio signal via a transmission medium TRM, comprising the data compression apparatus as shown in FIG. 1. The transmitter further comprises a transmission unit 40 for applying the data compressed information signal to the transmission medium TRM. The transmission unit 40 could comprise an antenna 42.

Figure 5:
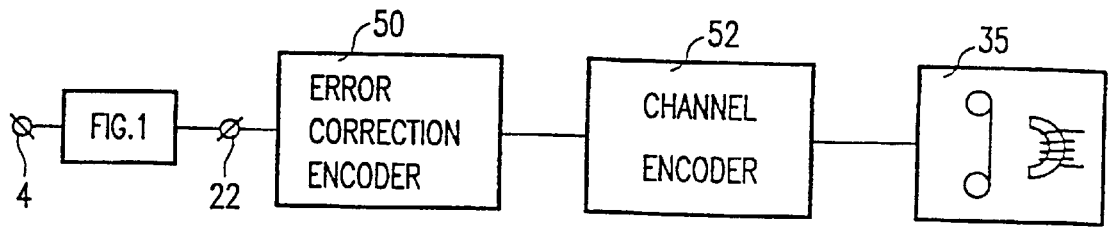
FIG. 5 shows a further embodiment of the recording apparatus, further provided with an error correction encoder and a channel encoder.

Transmission via a transmission medium, such as a radio frequency link or a record carrier, generally requires an error correction encoding and a channel encoding carried out on the data compressed information signal to be transmitted. FIG. 5 shows such signal processing steps carried out on the residual signal for the recording arrangement of FIG. 3. The recording arrangement of FIG. 5 therefore comprise an error correction encoder 50, well known in the art, and a channel encoder 52, also well known in the art.

Figure 6:
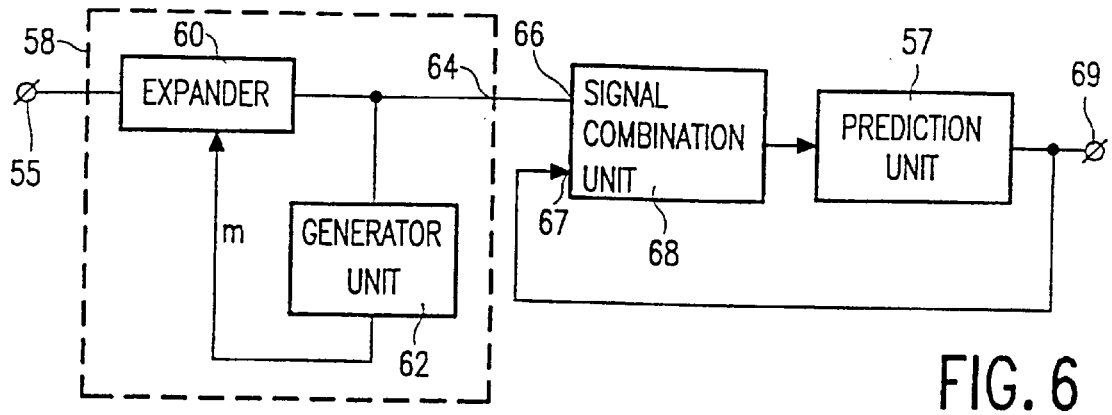
FIG. 6 shows an embodiment of the data expansion apparatus for reconverting the data compressed digital information signal into a replica of the original information signal.

FIG. 6 shows an embodiment of the data expansion apparatus in accordance with the invention. The apparatus has an input terminal 55 for receiving the data compressed words of the data compressed information signal. The input terminal 55 is coupled to an input of a data expansion unit 58 which is of the Huffman type. More specifically, the expansion unit 58 is in the form of a Rice decoder. The Rice decoder 58 includes a data expander 60 and a generator unit 62 for determining a parameter m, which is supplied to in the data expander 60 so as to enable decoding of the signal supplied to the input 55. The Rice decoder 58 supplies a replica of the information signal at its output 64, which output 64 is coupled to a first input 66 of a signal combination unit 68. An output of the signal combination unit 68 is coupled to an input of a prediction unit 57, well known in the art. An output of the prediction unit 57 is coupled to the output terminal 69 as well as to a second input 67 of the combination unit 68. The functioning of the combination unit 68 and the prediction unit 57 is well known in the art, in the sense that, in response to the information signal supplied to the input 66, which information signal is a replica of the residual signal present at the output 14 of the combination unit 10 of the apparatus of FIG. 1, a replica of the original audio signal is obtained at the output terminal 69.

The functioning of the Rice decoder 58 is explained hereafter. The generator unit 62 is identical to the generator unit 30 in the Rice encoder of FIG. 1, and thus derives the parameter m for the decoding of a sample in the data compressed information signal from N samples of the information signal previously decoded, in the same way as the generator unit 30 in FIG. 1.

The data expansion in the data expander 60 of a data compressed sample of the data compressed input signal supplied to the terminal 55 is realized as follows so as to obtain a 16-bit audio sample, as in the example given above. Use will be made of the data compressed word '?011001', obtained above, where m was equal to 3. The data expander 60 retrieves the first three bits '011' of the data compressed word following the sign bit '?', which three bits are the three least significant bits of the reconverted 16-bit sample. The two 'zero' bits in the remaining word '001' indicate that the remaining 13-bit word of the audio sample, after having extracted the three least significant bits, had a decimal value of 2, which results in a 13-bit word '0000 . . . 10'. The reconverted 16-bit audio sample thus equals '0000 . . . 10011', where the '?'-bit indicates the polarity of the sample.

When starting data expansion, it is not possible to derive a value for m from audio samples previously reconverted. So, for obtaining the first reconverted sample from the data expander 60, m is chosen equal to a predetermined value, eg. equal to p, or p/2. For decoding (reconverting/data expanding) the second sample, m could be obtained using the above formula for N=1, using the first reconverted sample value. For decoding the third sample, m could be obtained using the above formula for N=2, using the first and second reconverted sample value, and so on, until upon encoding the 11th sample the above formula can be used for N=10, using the previous ten reconverted sample values.

In the second option, described above for the data compression apparatus, the data expansion apparatus decodes blocks of data compressed samples, using an m-value received from the transmission medium.

Figure 7:
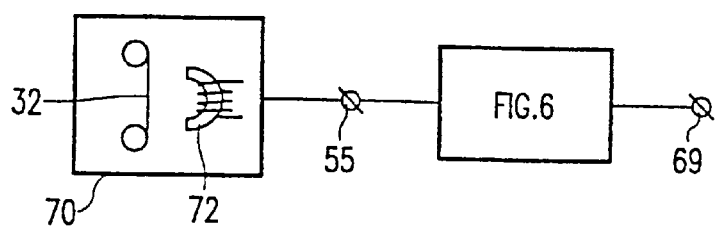
FIG. 7 shows the data expansion apparatus of FIG. 6 incorporated in a reproducing apparatus for reproducing the data compressed digital information signal from a record carrier.

FIG. 7 shows the data expansion apparatus of FIG. 6 incorporated in a reproduction apparatus. The reproducing apparatus further comprises a read unit 70 for reading the data compressed information signal from a track on the record carrier 52. In the present example, the record carrier 32 is a magnetic record carrier, so that the read unit 70 comprises at least one magnetic head 72 for reading the data compressed information signal from the record carrier 32. The record carrier may however be an optical record carrier, such as a CD disk or a DVD disk.

Figure 8:
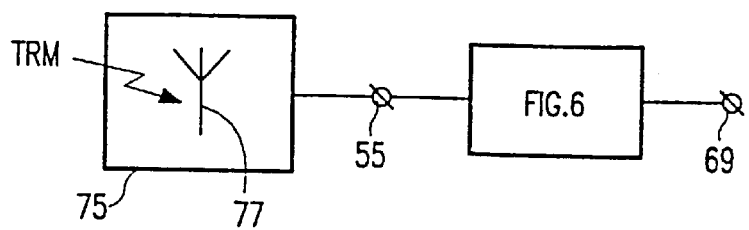
FIG. 8 shows the data expansion apparatus of FIG. 6 incorporated in a receiving apparatus for receiving the data compressed digital information signal from a transmission medium.

FIG. 8 shows an embodiment of a receiver for receiving an audio signal via a transmission medium TRM, comprising the data expansion apparatus as shown in FIG. 6. The receiver further comprises a receiving unit 75 for receiving the data compressed signal from the transmission medium TRM. The receiving unit 75 could comprise an antenna 77.

Figure 9:
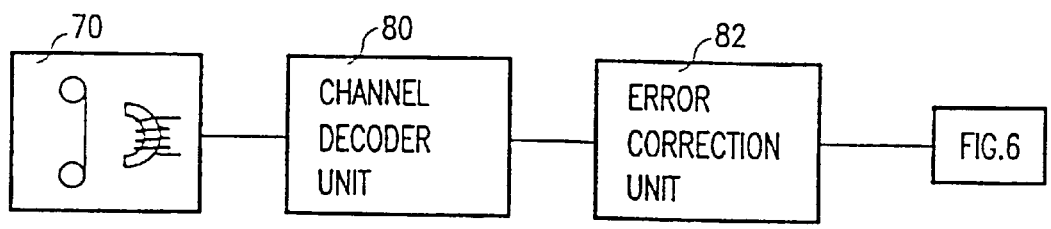
FIG. 9 shows a further embodiment of the reproducing apparatus, further provided with a channel decoder and an error correction unit.

As has been explained above, transmission via a transmission medium, such as a radio frequency link or a record carrier, generally requires an error correction encoding and a channel encoding carried out on the data compressed information to be transmitted, so that a corresponding channel decoding and error correction can be carried out upon reception. FIG. 9 shows the signal processing steps of channel decoding and error correction carried out on the received signal, received by the reading means 70 for the reproducing arrangement of FIG. 7. The reproducing arrangement of FIG. 9 therefore comprise a channel decoder 80, well known in the art, and an error correction unit 82, also well known in the art, so as to obtain a replica of the original audio signal.

Whilst the invention has been described with reference to preferred embodiments thereof, it is to be understood that these are not limitative examples. Thus, various modifications may become apparent to those skilled in the art, without departing from the scope of the invention, as defined by the claims.

Further, the invention lies in each and every novel feature or combination of features.

I claim:

1. A data compression apparatus for data compressing a digital information signal obtained from a digital audio signal, the digital information signal comprising p-bit samples, where p is an integer larger than 1, the apparatus comprising:

means for receiving the digital information signal, lossless compression means for carrying out a substantially lossless compression step on the digital information signal so as to obtain a data compressed digital information signal, the lossless compression means comprising a Huffman type encoder, output means for supplying the data compressed digital information signal, characterized in - that the Huffman type encoder is a Rice encoder, which Rice encoder is distinguishable by a code parameter m, the Rice encoder comprising generator means for generating said code parameter from N samples of the digital information signal in accordance with the following formula:

$$A \cdot \log_2 m = \left\{ \left(\frac{B}{N}\right) \cdot \sum_{n=1}^{N} |x[n]| \right\}$$

where A and B are constants and x[n] is the n-th sample of the N samples, where N is an integer larger than 0.

2. Apparatus as claimed in claim 1, wherein the generator means are adapted to generate said code parameter for subsequent frames of N samples of the digital information signal, the generator means being adapted to generate the code parameter for a frame in accordance with said formula, where x[n] is the n-th sample in said frame and where N is larger than 1.

3. Apparatus as claimed in claim 1, wherein m=⌊M, where $$M = A \cdot \log_2 \left\{ \left(\frac{B}{N}\right) \cdot \sum_{n=1}^{N} |x[n]| \right\}$$

and the sign '⌊' signifies a rounding of the value of M to the value of the nearest lower integer.

4. Apparatus as claimed in claim 1, wherein A=1 and B=1.

5. Apparatus as claimed in claim 1, further comprising prediction means having an input for receiving the digital audio signal and signal combination means, the prediction means being adapted to receive the digital audio signal and to generate an output signal which is a predicted version of the digital audio signal, the signal combination means being adapted to combine the audio signal and the predicted version of the audio signal in a subtractive way so as to obtain said digital information signal and to supply the digital information signal to said terminal means.

6. Transmitter for transmitting a data compressed digital information signal via a transmission medium, wherein the transmitter comprises the data compression apparatus as claimed in claim 1, the transmitter further comprising means for applying the data compressed digital information signal to the transmission medium.

7. Transmitter as claimed in claim 6, wherein the transmitter further comprises error correction encoding means and/or channel encoding means, for error correction encoding and/or channel encoding the data compressed digital information signal prior to applying the data compressed digital information signal to the transmission medium.

8. Transmitter as claimed in claim 6, which is in the form of a recording apparatus for recording the data compressed digital information signal in a track on a record carrier, comprising writing means for writing the data compressed digital information signal on the record carrier.

9. A data expansion apparatus for data expanding a data compressed digital information signal obtained from a digital audio signal, the apparatus comprising:

input means for receiving the data compressed digital information signal, lossless expanding means for carrying out a substantially lossless data expansion step on the data compressed digital information signal so as to obtain a replica of the digital information signal, the lossless expanding means comprising a Huffman type decoder, output means for supplying the replica of the digital information signal, characterized in that the Huffman type decoder is a Rice decoder, which Rice decoder is distinguishable by a code parameter m, the Rice decoder comprising generator means for generating said code parameter from N samples of the replica of the digital information signal in accordance with the following formula:

$$M = A \cdot \log_2 \left\{ \left(\frac{B}{N}\right) \cdot \sum_{n=1}^{N} |x[n]| \right\}$$

where A and B are constants and x[n] is the n-th sample of the N samples, where N is an integer larger than 0.

10. Apparatus as claimed in claim 9, wherein m =⌊M, where $$M = A \cdot \log_2 \left\{ \left(\frac{B}{N}\right) \cdot \sum_{n=1}^{N} |x[n]| \right\}$$

and the sign '⌊' signifies a rounding of the value of M to the value of the nearest lower integer.

11. Apparatus as claimed in claim 9, wherein A=1 and B=1.

12. Receiver for receiving a data compressed digital information signal from a transmission medium, wherein the receiver comprises the data expansion apparatus as claimed in claim 9, the receiver further comprising means for retrieving the data compressed digital information signal from the transmission medium.

13. Receiver as claimed in claim 12, wherein the receiver further comprises channel decoding means and/or error correction means, for channel decoding and/or error correcting the data compressed digital information signal prior to data expanding the data compressed digital information signal.

14. Receiver as claimed in claim 12, which is in the form of a reproducing apparatus for reproducing the data compressed digital information signal from a track on a record carrier, comprising reading means for reading the data compressed digital information signal from the record carrier.

15. A method for data compressing a digital information signal obtained from a digital audio signal, the digital information signal comprising p-bit samples, where p is an integer larger than 1, the method comprising the steps of:

receiving the digital information signal, carrying out a substantially lossless compression step on the digital information signal so as to obtain a data compressed digital information signal, the lossless compression means comprising a Huffman type encoding step, supplying the data compressed digital information signal, characterized in that the Huffman type encoder step is an encoding step using a Rice encoder, which Rice encoder is distinguishable by a code parameter m, the Rice encoding step comprising the substep of generating said code parameter from N samples of the digital information signal in accordance with the following formula:

$$m = A \cdot \log_2 \left\{ \left( \frac{B}{N} \right) \cdot \sum_{n=1}^{N} |x[n]| \right\}$$

where A and B are constants and x[n] is the n-th sample of the N samples, where N is an integer larger than 0.

* * * * *